United States Patent
Mohn et al.

(10) Patent No.: US 10,192,800 B2
(45) Date of Patent: Jan. 29, 2019

(54) SEMICONDUCTOR DEVICE

(71) Applicant: ABB Schweiz AG, Baden (CH)

(72) Inventors: Fabian Mohn, Ennetbaden (CH); Paul Commin, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/819,579

(22) Filed: Nov. 21, 2017

(65) Prior Publication Data

US 2018/0090401 A1 Mar. 29, 2018

Related U.S. Application Data

(63) Continuation of application No. PCT/EP2016/056140, filed on Mar. 21, 2016.

(30) Foreign Application Priority Data

May 19, 2015 (EP) .................................... 15168083

(51) Int. Cl.
*H01L 23/16* (2006.01)
*H01L 23/051* (2006.01)
*H01L 23/00* (2006.01)

(52) U.S. Cl.
CPC ............ *H01L 23/051* (2013.01); *H01L 23/16* (2013.01); *H01L 24/01* (2013.01)

(58) Field of Classification Search
CPC ........ H01L 23/05; H01L 23/051; H01L 23/16
(Continued)

(56) References Cited

U.S. PATENT DOCUMENTS

| 4,099,201 A | 7/1978 | Mueller |
| 4,399,452 A | 8/1983 | Nakashima et al. |

(Continued)

FOREIGN PATENT DOCUMENTS

| DE | 3032133 C2 | 5/1987 |
| DE | 8909244 U1 | 9/1989 |

(Continued)

OTHER PUBLICATIONS

European Patent Office, International Search Report & Written Opinion issued in corresponding Application No. PCT/EP2016/056140, dated Jun. 7, 2016, 11 pp.

(Continued)

*Primary Examiner* — Monica D Harrison
(74) *Attorney, Agent, or Firm* — J. Bruce Schelkopf; Taft Stettinius & Hollister LLP

(57) ABSTRACT

A semiconductor device comprises two electrodes with opposite faces; a semiconductor wafer sandwiched between the two electrodes; an outer insulating ring attached to the two electrodes and surrounding the semiconductor wafer; a middle insulating ring inside the outer insulating ring and surrounding the semiconductor wafer, whereby the middle insulating ring is made of a plastics material; and an inner insulating ring inside the middle insulating ring, whereby the inner insulating ring is made of ceramics and/or glass material. Either the middle insulating ring or the inner insulating ring has a tongue and the other thereof has a groove such that the tongue fits into the groove for their rotational alignment. The middle insulating ring and the inner insulating ring have a radial opening for receiving a gate connection of the semiconductor device.

20 Claims, 2 Drawing Sheets

(58) Field of Classification Search
USPC .......................................................... 257/695
See application file for complete search history.

(56) References Cited

U.S. PATENT DOCUMENTS

| | | | |
|---|---|---|---|
| 5,489,802 A * | 2/1996 | Sakamoto | H01L 23/051 257/688 |
| 5,633,536 A | 5/1997 | Nakashima et al. | |
| 5,990,501 A | 11/1999 | Hiyoshi et al. | |
| 9,076,826 B2 * | 7/2015 | de la Llera | H01L 21/67069 |

FOREIGN PATENT DOCUMENTS

| | | |
|---|---|---|
| DE | 19710207 A1 | 9/1998 |
| DE | 10306767 A1 | 8/2004 |
| EP | 2447988 A1 | 5/2012 |
| JP | S5687349 A | 7/1981 |
| JP | H04114474 A | 4/1992 |
| JP | H1187375 A | 3/1999 |
| WO | 2014184061 A1 | 11/2014 |

OTHER PUBLICATIONS

European Patent Office, Extended Search Report issued in corresponding Application No. 15168083.2, dated Nov. 4, 2015, 8 pp.

* cited by examiner

SEMICONDUCTOR DEVICE

FIELD OF THE INVENTION

The invention relates to a power semiconductor device, which may be stacked with other equally designed power semiconductor devices.

BACKGROUND OF THE INVENTION

Such press-pack semiconductor devices may be used in high-power converter applications such as high-current rectifiers or medium-voltage drives. In these systems, fault situations may occur in which a device loses its blocking capability and may be subject to an excessive fault current in the reverse direction. The local heating caused by this fault current may lead to electric arcing inside the device. The high temperature of the electric arc (~20,000° C.) and the resulting pressure increase may cause damage to the hermetically sealed press-pack housings.

If the energy released in the arc is sufficiently high, the arc plasma may burn through thin metal flanges of the housing, or may crack a ceramics insulating ring of the housing, which surrounds a Si wafer. Fast-enough fuses may be used to protect the semiconductor device. Also, a housing design that will not rupture under the expected short-circuit current integral may provide further protection.

To prevent the impact of the arc plasma on the flanges and ceramics ring and thereby improve the non-rupture capabilities of a press-pack semiconductor device, a protective ring-shaped part made of polymer material may be arranged in the volume between the ceramics ring and the Si wafer.

DE 103 06 767 A1 relates to a press-pack semiconductor device with a housing isolator, interposed between two electrodes. Inside the housing isolator, a further isolator surrounds a semiconductor element.

DE 89 09 244 U1 shows a press-pack semiconductor device having a ceramics ring as part of a housing. Inside the ceramics ring a Teflon band may be arranged.

DE 30 32 133 C2 shows a press-pack semiconductor device with a cylinder element of ceramics surrounding an explosion protection element of silicone, in which the semiconductor is arranged.

In EP 2447988 A1 a semiconductor device is disclosed, that comprises two electrodes with opposite faces, a semiconductor wafer sandwiched between the two electrodes, an outer insulating ring attached to the two electrodes and surrounding the semiconductor wafer, a middle insulating ring inside the outer insulating ring and surrounding the semiconductor wafer, whereby the middle insulating ring is made of a plastics material, and an inner insulating ring inside the middle insulating ring, whereby the inner insulating ring is made of ceramics and/or glass material. A very similar semiconductor device is shown in JP H04114474 A.

Moreover, DE 19710207 A1 discloses a well-known and generic housing of a power electronic element.

DESCRIPTION OF THE INVENTION

Sometimes, due to the arc, pressure may develop inside the housing due to ablation of a polymer material, which also may limit the non-rupture capabilities of the housing of the semiconductor device.

It is an objective of the invention to enhance non-rupture capabilities of a semiconductor device.

This objective is achieved by the subject-matter of the independent claim. Further exemplary embodiments are evident from the dependent claims and the following description.

The invention relates to a semiconductor module or semiconductor device, which may be a power semiconductor module/device adapted for switching currents of more than 10 A and/or 1.000 V.

According to an embodiment of the invention, the semiconductor device comprises two electrodes with opposite faces, a semiconductor wafer sandwiched between the two electrodes, an outer insulating ring attached to the two electrodes and surrounding the semiconductor wafer, a middle insulating ring inside the outer insulating ring and surrounding the semiconductor wafer, wherein the middle insulating ring is made of a plastics material, and an inner insulating ring inside the middle insulating ring, wherein the inner insulating ring is made of ceramics or glass material. Also the inner insulating ring may surround the semiconductor wafer. Furthermore, either the middle insulating ring or the inner insulating ring has a tongue and the other thereof has a groove such that the tongue fits into the groove for their rotational alignment. In particular in the case, when a gate wire from the semiconductor wafer has to be led through the inner insulating ring and the middle insulating ring, the corresponding openings for the gate wire may be aligned by a tongue or protrusion of the middle insulating ring that fits into a corresponding opening or groove in the inner insulating ring (or vice versa). Moreover, the middle insulating ring and the inner insulating ring have a radial opening for receiving a gate connection (such as a wire) of the semiconductor device. This opening(s) either may be a through hole and/or a groove extending substantially in radial direction.

The electrodes and the outer insulating ring may form an outer (press-pack) housing of the semiconductor device, which may hermetically seal the semiconductor wafer. Inside this housing, two further protection rings of different insulating materials are arranged: a middle insulating ring of plastics material and an inner insulating ring of ceramics or glass material. These two rings may be provided as one member or as two members. The inner ceramics insulating ring may protect the middle plastics insulating ring from arcing and/or may enable much higher case-non-rupture currents than the plastics insulating ring alone.

It was found in high-current tests, that a major limitation of arc protection solution for press-pack housings is the fact that ablation of a polymer protection ring by the arc plasma may cause a significant pressure development (10 bar or higher). This pressure development may limit the non-rupture capability of the housing, for example by causing a rupturing of the weld between parts of the housing. In order to achieve higher non-rupture capabilities, an insulating ring for arc protection made from a plastics material (which may be advantageous regarding its mechanical properties, electrical insulation, and/or cost and manufacturability) is combined with a high-temperature-resistant material such as ceramics or glass that will reduce arc ablation and resulting pressure development, and also reduce the direct impact of the pressure wave on the plastics insulating ring.

The middle insulating ring may be made from a plastics material and/or may have a lower thermal stability as the inner insulating ring. However, it may be more flexible and/or may provide structural stability for the inner insulating ring, even if the inner insulating ring cracks due to the exposure to an arc plasma.

The inner insulating ring may be made from a high-temperature-resistant ceramics or glass material and/or may withstand direct exposure to an arc plasma without excessive pressure development. However, the inner insulating ring may be stiffer than the middle insulating ring. The solid ceramics parts of the inner insulating ring may provide a better shielding of the plastics insulating ring in the event of an electric arc.

The inner insulating ring may be made of ceramics material, such as $Al_2O_3$, $Si_3N_4$, machinable glass-ceramics material and/or glass material.

For example, the outer, middle and/or inner insulating ring may have a circular shape and/or may be concentric with respect to each other. However, these rings also may have other forms.

According to an embodiment of the invention, the middle insulating ring and the inner insulating ring are two different members nested into each other. For example, there may be provided two kinds of semiconductor devices with nearly the same design. A device with lower arc protection may only contain the middle insulating ring, whereas a device with high arc protection may have the same design, while the inner insulating ring is put into the middle insulating ring.

According to an embodiment of the invention, the inner insulating ring is coated onto the middle insulating ring. It also may be possible that the middle insulating ring and the inner insulating ring are provided as one member. The middle insulating ring may be at least partially coated with a ceramics and/or glass material.

In this case, when two nearly equally designed devices with lower and higher arc protection, respectively, are provided, even the part count may remain the same, so no additional assembly steps are needed. In one case an uncoated insulating ring and in the other case a coated insulating ring may be provided.

For example, a polymer insulating ring may at least partially coated with a ceramics material, such as $TiO_2$ and/or $Al_2O_3$, which may be prepared by plasma spraying.

According to an embodiment of the invention, the outer insulating ring is made of ceramics material, which may be the same or a different material as the one of the inner insulating ring.

According to an embodiment of the invention, the middle insulating ring is made of a polymer material. Examples for such materials are PTFE, PPA, PEI and/or silicone.

According to an embodiment of the invention, the middle insulating ring comprises an axially extending rim plugged into an annular groove of one of the electrodes. The outer insulating ring may be welded to the electrodes, whereas the middle and the inner ring may be only stuck together with the other part of the housing.

According to an embodiment of the invention, the middle insulating ring comprises an annular protrusion, which protrudes towards the semiconductor wafer, wherein the inner insulating ring rests on the annular protrusion. For example, the middle ring may have a substantially L-shaped cross section. The other end of the inner insulating ring (opposite to the end in contact with the protrusion) may be in contact with an electrode, which may be stuck into the middle insulating ring. In such a way, an arc may not reach the middle insulating ring.

According to an embodiment of the invention, the middle insulating ring comprises a radially extending rim accommodated between one of the electrodes and a rubber ring surrounding the semiconductor wafer inside the inner insulating ring. The rubber ring may protect the surface of the wafer, which is not in direct contact with an electrode.

According to an embodiment of the invention, the rubber ring is accommodated between an annular protrusion of the middle insulating ring and the semiconductor wafer. This may be the protrusion on which the inner insulating ring rests.

According to an embodiment of the invention, each of the electrodes comprises a radially extending flange to which the outer insulating ring is attached. Each of the electrodes may comprise a massive, circular body, which has ring-shaped flanges on each side, which are used for attaching the outer insulating ring.

According to an embodiment of the invention, the electrodes are made from copper. However, also other materials such as aluminum may be used for the electrodes.

According to an embodiment of the invention, the semiconductor device further comprises a molybdenum layer between at least one of the electrodes and the semiconductor wafer. The semiconductor wafer may be based on silicon (Si). In this case, a molybdenum layer may account of the different coefficients of thermal expansion of Si and the copper electrodes.

According to an embodiment of the invention, the wafer comprises a semiconductor switch, which may be a thyristor, a transistor and/or a diode. The semiconductor device may house any kind of high power switch.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
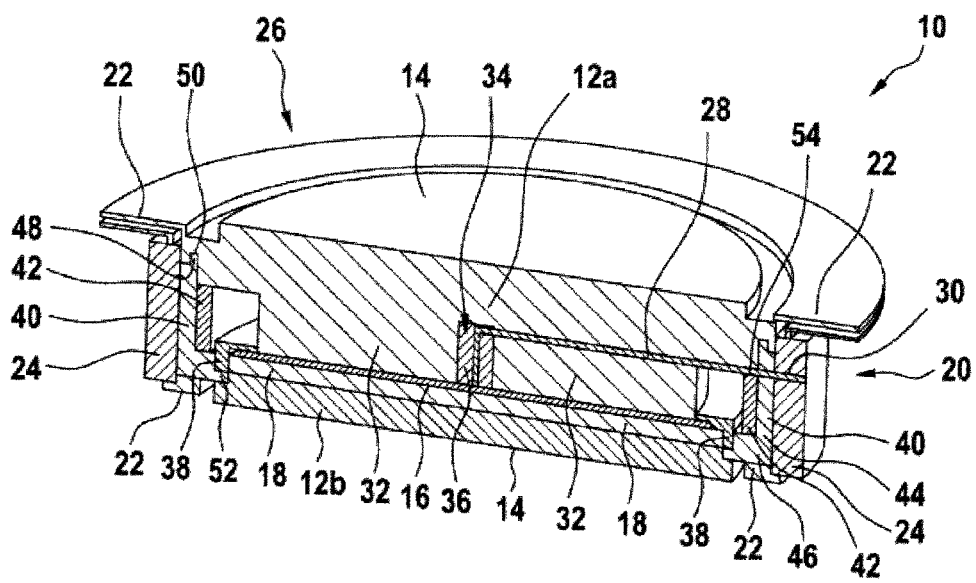
FIG. 1 shows a perspective view of a cross-section of a semiconductor device according to an embodiment of the invention.

FIG. 1 shows a semiconductor device 10 comprising two copper electrodes 12a, 12b with opposite parallel faces 14 and a silicon wafer 16 sandwiched between the two electrodes 12a, 12b. Additionally, a molybdenum layer 18 may be interposed between the lower electrode 12b and the wafer 16 and/or the upper electrode 12a and the wafer 16. The silicon wafer 16, containing a semiconductor switch 20 such as a thyristor, may be clamped between the electrodes 12 and the optional buffer layers 18.

As an alternative to a free-floating design, the wafer 16 may be bonded to a thick molybdenum support layer on the bottom electrode 12b, for example by using a low-temperature bonding process. This may have advantages in terms of cooling of the semiconductor device 10.

The semiconductor device 10 may be stacked with other equally designed semiconductor devices 10 and the faces 14 of the electrodes 12a, 12b may function as contact pole pieces in this case.

The electrodes 12a, 12b comprise thin flexible flanges 22 (which may be also made of copper), which extend in a radial direction from the electrodes 12a, 12b and/or which surround the contact faces 14 in the form of a ring.

An outer insulating ring 24 of ceramics (which may have the form of a hollow cylinder and may further comprise fin structure to ensure the necessary clearance and/or creepage distances between the upper electrode 12a and the lower electrode 12b, which may be on different electrical potentials), which is attached to the flanges 22, surrounds the inner components of the semiconductor device 10, such as the wafer 16, the molybdenum layer(s) 18 and inner part of the electrodes 12a, 12b.

The outer insulating ring 24 forms the side wall of a press-pack housing 26 of the semiconductor device 10. The housing 26 furthermore comprises the two electrodes 12a, 12b, which, for example, may be welded to the outer ring 24, thus yielding a hermetically sealed housing 26.

In the case of a controllable switch 20, a gate connection 28 in the form of a wire may be guided from the center of the wafer 18 out of the side wall, i.e. out of the outer insulating ring 24. In this case, the outer insulating ring 24 may have an opening 30 for the gate connection 28 and/or the upper electrode 12a may be assembled of two parts 32, which when stacked together form a channel through the electrode 12a for receiving the gate connection 28.

The upper electrode 12a and/or the upper molybdenum layer 18 may have a central opening 34, in which a spring element 36 is received that is used for pressing the gate connection 28 onto the wafer 16.

The upper electrode 12a may not completely cover its side of the wafer 16 and a rubber ring 38, surrounding an inner part of the electrode 12a, may cover a rim of the wafer 16 and the side of the wafer 16.

For a better arc protection, the semiconductor device 10 comprises a middle insulating ring 40 of plastics material and an inner insulating ring 42 of ceramics or glass material. The middle insulating ring 40 may be more temperature sensitive as the inner insulating ring 42, whereas the middle insulating ring 40 may be more mechanically flexible as the inner insulating ring 42. For example, the middle insulating ring may be formed from PTFE and the inner insulating ring 42 may be formed of a high-temperature-resistant ceramics material.

The insulating rings 24, 40, 42 may be concentric. The inner insulating ring 42 may be formed like a hollow cylinder, i.e. may have a cylindrical inner and outer face.

Figure 2:
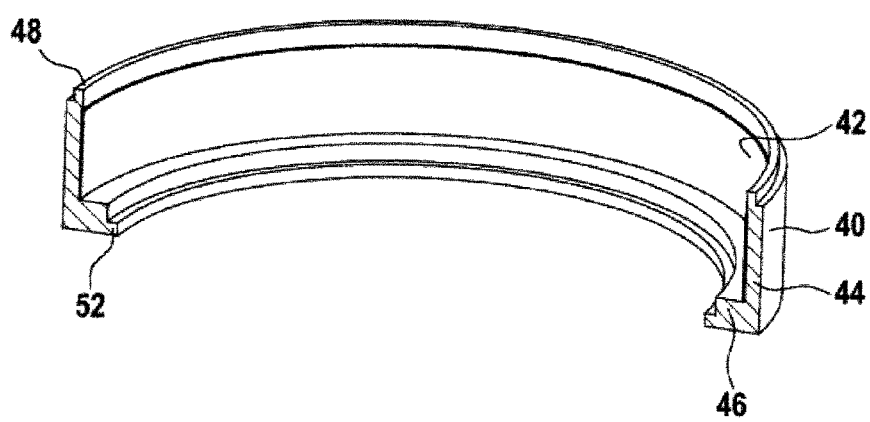
FIG. 2 shows a perspective view of a cross-section of a member of a semiconductor device according to an embodiment of the invention.
Figure 4:
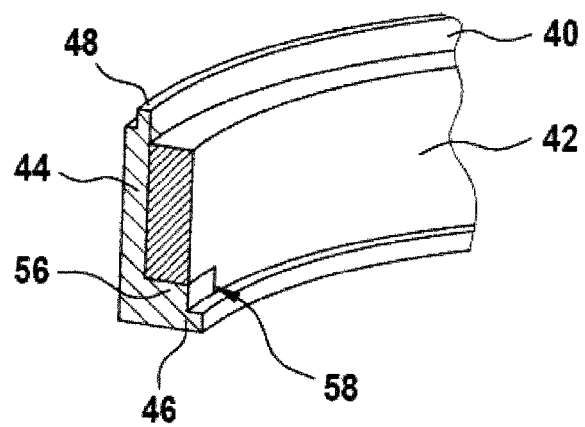
FIG. 4 shows a partial cross-section of a middle and inner ring for a semiconductor device according to an embodiment of the invention.

The middle insulating ring 40 may have a substantially L-shaped cross-section (see also FIGS. 2 and 4). The middle insulating ring 40 may have an axially aligned wall 44 and a protrusion 46 protruding radially inwards. The inner ring 40 may rest on this protrusion 46.

A rim 48 extends axially from the wall 44 and is stuck into a groove 50 surrounding the upper electrode 12a. A further rim 52 extends radially inwards from the protrusion 46 and is stuck between the rubber ring 38 and the lower electrode 12b.

Figure 3:
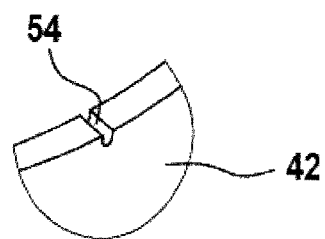
FIG. 3 shows a part of an inner ring for a semiconductor device according to an embodiment of the invention.

The middle insulating ring 40 and the inner insulating ring 42 may have an opening 54 for leading through the gate connection 28. As shown in FIG. 3, this opening 54 may be provided as a groove in the inner insulating ring 42.

In FIG. 1, the two insulating rings 40, 42 are two members, which are nested into each other.

FIG. 2 shows, that the inner insulating ring 42 may be coated onto the middle insulating ring 40. This coating may be provided on the inner side of the wall 44 as well as the protrusion 46 and/or the rim 52.

FIG. 4 shows that for aligning the openings 54 of the middle insulating ring 40 and the inner insulating ring 42, the rings 40, 42 may have a tongue- and groove-structure. For example, the insulating ring 40 may have a tongue 56 that fits into a groove 58 of the ring 42.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 semiconductor device
12a upper electrode
12b lower electrode
14 face of electrode
16 wafer
18 molybdenum layer
20 semiconductor switch
22 flange of electrode
24 outer insulating ring
26 housing
28 gate connection
30 opening
32 parts of upper electrode
34 opening
36 spring element
38 rubber ring
40 middle insulating ring
42 inner insulating ring
44 wall of middle insulating ring
46 protrusion
48 rim
50 groove
52 rim
54 opening
56 tongue
58 groove

The invention claimed is:
1. A semiconductor device, comprising:
two electrodes with opposite faces;
a semiconductor wafer sandwiched between the two electrodes;
an outer insulating ring attached to the two electrodes and surrounding the semiconductor wafer;
a middle insulating ring inside the outer insulating ring and surrounding the semiconductor wafer, whereby the middle insulating ring is made of a plastics material;

an inner insulating ring inside the middle insulating ring, whereby the inner insulating ring is made of ceramics and/or glass material;
wherein either the middle insulating ring or the inner insulating ring has a tongue and the other thereof has a groove such that the tongue fits into the groove for their rotational alignment and
wherein the middle insulating ring and the inner insulating ring have a radial opening for receiving a gate connection of the semiconductor device.

2. The semiconductor device of claim 1,
wherein the middle insulating ring and the inner insulating ring are two different members nested into each other.

3. The semiconductor device of claim 2, wherein the outer insulating ring is made of ceramics material.

4. The semiconductor device of claim 2, wherein the middle insulating ring comprises an axially extending rim plugged into an annular groove of one of the electrodes.

5. The semiconductor device of claim 2, wherein the middle insulating ring comprises an annular protrusion, which protrudes towards the semiconductor wafer, wherein the inner insulating ring rests on the annular protrusion.

6. The semiconductor device of claim 2, wherein the middle insulating ring comprises a radially extending rim accommodated between one of the electrodes and a rubber ring surrounding the semiconductor wafer inside the inner insulating ring; and
wherein the rubber ring is accommodated between an annular protrusion of the middle insulating ring and the semiconductor wafer.

7. The semiconductor device of claim 2, wherein the wafer carries a semiconductor switch, being at least one of a thyristor, a transistor and/or a diode.

8. The semiconductor device of claim 1,
wherein the inner insulating ring is coated onto the middle insulating ring.

9. The semiconductor device of claim 8, wherein the outer insulating ring is made of ceramics material.

10. The semiconductor device of claim 1,
wherein the outer insulating ring is made of ceramics material.

11. The semiconductor device of claim 10, wherein the middle insulating ring comprises an axially extending rim plugged into an annular groove of one of the electrodes.

12. The semiconductor device of claim 1,
wherein the middle insulating ring is made of a polymer material.

13. The semiconductor device of claim 1,
wherein the middle insulating ring comprises an axially extending rim plugged into an annular groove of one of the electrodes.

14. The semiconductor device of claim 1,
wherein the middle insulating ring comprises an annular protrusion, which protrudes towards the semiconductor wafer, wherein the inner insulating ring rests on the annular protrusion.

15. The semiconductor device of claim 1,
wherein the middle insulating ring comprises a radially extending rim accommodated between one of the electrodes and a rubber ring surrounding the semiconductor wafer inside the inner insulating ring.

16. The semiconductor device of claim 15,
wherein the rubber ring is accommodated between an annular protrusion of the middle insulating ring and the semiconductor wafer.

17. The semiconductor device of claim 1,
wherein each of the electrodes comprises a radially extending flange to which the outer insulating ring is attached.

18. The semiconductor device of claim 1,
wherein the electrodes are made from copper.

19. The semiconductor device of claim 1, further comprising:
a molybdenum layer between at least one of the electrodes and the wafer; and/or
wherein the wafer is made from silicon.

20. The semiconductor device of claim 1,
wherein the wafer carries a semiconductor switch, being at least one of a thyristor, a transistor and/or a diode.

\* \* \* \* \*